(12) United States Patent
Morales (10) Patent No.: US 11,343,938 B2
(45) Date of Patent: *May 24, 2022

(54) AIRFLOW CONTROL SYSTEM WITH EXTERNAL AIR CONTROL

(71) Applicant: Amazon Technologies, Inc., Reno, NV (US)

(72) Inventor: Osvaldo P. Morales, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 1143 days.

This patent is subject to a terminal disclaimer.

(21) Appl. No.: 14/275,390

(22) Filed: May 12, 2014

(65) Prior Publication Data

US 2014/0248829 A1    Sep. 4, 2014

Related U.S. Application Data

(63) Continuation of application No. 11/956,849, filed on Dec. 14, 2007, now Pat. No. 8,721,409.

(60) Provisional application No. 60/953,078, filed on Jul. 31, 2007.

(51) Int. Cl.
*H05K 7/20*      (2006.01)

(52) U.S. Cl.
CPC ..... *H05K 7/20209* (2013.01); *H05K 7/20745* (2013.01); *H05K 7/20836* (2013.01)

(58) Field of Classification Search
CPC .......... H05K 7/20209; H05K 7/20245; H05K 7/20836

USPC ......................................................... 454/184
See application file for complete search history.

(56) References Cited

U.S. PATENT DOCUMENTS

| | | | | |
|---|---|---|---|---|
| 2,290,096 | A | * | 7/1942 | Dale ......................... F24F 11/30 236/49.4 |
| 3,116,786 | A | * | 1/1964 | Menditch ................. F24F 11/30 165/217 |
| 3,517,601 | A | * | 6/1970 | Courchesne ............ F24F 7/013 454/228 |
| 4,103,508 | A | * | 8/1978 | Apple ....................... F24F 3/14 62/92 |
| 4,118,945 | A |   | 10/1978 | Boochever et al. |

(Continued)

OTHER PUBLICATIONS

U.S. Appl. No. 11/956,849, filed Dec. 14, 2007, Osvaldo P. Morales.
(Continued)

*Primary Examiner* — Steven S Anderson, II
*Assistant Examiner* — Phillip Decker
(74) *Attorney, Agent, or Firm* — Robert C. Kowert; Kowert, Hood, Munyon, Rankin & Goetzel, P.C.

(57) ABSTRACT

A cooling system includes one or more air channeling sub-systems that provide cooling air to electronic equipment, at least one heat removal sub-system that removes heat from the cooling air in at least one of the air channeling sub-systems, at least one temperature sensor measures a wet bulb temperature of outside air, and at least one controller. At least one of the air channeling sub-systems includes an outside air damper operable allow outside air into the air channeling sub-system. The at least one controller at least partially opens the outside air damper if a wet bulb temperature measured at the at least one temperature sensor drops to or below a predetermined temperature.

18 Claims, 7 Drawing Sheets

(56) References Cited

U.S. PATENT DOCUMENTS

| | | | |
|---|---|---|---|
| 4,605,160 A * | 8/1986 | Day | F24F 11/08 |
| | | | 137/111 |
| 5,324,229 A * | 6/1994 | Weisbecker | F24F 13/04 |
| | | | 236/49.3 |
| 6,076,739 A | 6/2000 | Littleford et al. | |
| 6,141,986 A | 11/2000 | Koplin | |
| 6,298,912 B1 | 10/2001 | Rayburn et al. | |
| 6,700,780 B2 | 3/2004 | Hedberg et al. | |
| 6,742,583 B2 | 6/2004 | Tikka | |
| 6,747,872 B1 * | 6/2004 | Patel | G06F 1/206 |
| | | | 361/695 |
| 6,772,604 B2 * | 8/2004 | Bash | G05D 23/1931 |
| | | | 236/49.3 |
| 6,826,920 B2 | 12/2004 | Wacker | |
| 7,010,392 B2 | 3/2006 | Bash et al. | |
| 7,197,433 B2 | 3/2007 | Patel et al. | |
| 7,278,273 B1 | 10/2007 | Whitted et al. | |
| 7,484,668 B1 * | 2/2009 | Eiler | F24F 3/16 |
| | | | 236/49.3 |
| 8,051,671 B2 * | 11/2011 | Vinson | H05K 7/20745 |
| | | | 62/259.2 |
| 8,091,376 B2 * | 1/2012 | Bianchi | F24F 1/0033 |
| | | | 165/126 |
| 8,195,335 B2 | 6/2012 | Kreft et al. | |
| 8,583,289 B2 | 11/2013 | Stack et al. | |
| 8,641,490 B2 * | 2/2014 | Eisenhour | B60H 1/00849 |
| | | | 454/139 |
| 2002/0124992 A1 | 9/2002 | Rainer et al. | |
| 2005/0228618 A1 | 10/2005 | Patel et al. | |
| 2006/0068695 A1 | 3/2006 | Kelley et al. | |
| 2007/0101746 A1 | 5/2007 | Scholm et al. | |
| 2008/0029250 A1 | 2/2008 | Carlson et al. | |
| 2008/0055846 A1 | 3/2008 | Clidaras et al. | |
| 2008/0094797 A1 | 4/2008 | Coglitore et al. | |
| 2008/0259566 A1 | 10/2008 | Fried | |

OTHER PUBLICATIONS

U.S. Appl. No. 11/535,180, filed Sep. 26, 2006, Osvaldo Patricio Morales.

U.S. Appl. No. 12/341,137, filed Dec. 28, 2008, Jonathan David Hay.

U.S. Appl. No. 12/163,146, filed Jun. 27, 2008, Osvaldo P. Morales.

* cited by examiner

AIRFLOW CONTROL SYSTEM WITH EXTERNAL AIR CONTROL

This application is a continuation of U.S. patent application Ser. No. 11/956,849, filed Dec. 14, 2007, now U.S. Pat. No. 8,721,409, which claims benefit of U.S. Provisional Patent Application 60/953,078 filed Jul. 31, 2007 which are hereby incorporated by reference in their entirety.

BACKGROUND

Field of the Invention

The present invention relates generally to cooling systems and more particularly, to methods and apparatus for cooling electronic components.

Description of the Related Art

Some known electronic components generate waste heat energy when energized. This heat energy should be removed to mitigate a potential for component overheating and subsequent malfunction. Computer systems typically include a number of such components, or waste heat sources, that include, but are not limited to, printed circuit boards, mass storage devices, power supplies, and processors. For example, one personal computer system may generate 100 watts to 150 watts of waste heat and some larger computers with multiple processors may generate 250 watts of waste heat. Some known computer systems include a plurality of such larger, multiple-processor computers that are configured into rack-mounted components, and then are subsequently positioned within a racking system. Some known racking systems include 40 such rack-mounted components and such racking systems will therefore generate as much as 10 kilowatts of waste heat. Moreover, some known data centers include a plurality of such racking systems.

Some known data centers include methods and apparatus configured to facilitate waste heat removal from a plurality of racking systems. Moreover, some known data centers include a plurality of racking systems that have a plurality of configurations that are non-uniform with respect to component density and usage such that each racking system generates waste heat at a non-uniform rate as compared to the remainder of the racking systems. In such data centers, application of uniform heat removal methods and apparatus to such non-uniform waste heat generation sources may not be fully efficient and effective in waste heat removal.

SUMMARY

Various embodiments of a system and method for cooling electronic equipment are disclosed. According to one embodiment, a cooling system includes one or more air channeling sub-systems that provide cooling air to electronic equipment, at least one heat removal sub-system that removes heat from the cooling air in at least one of the air channeling sub-systems, at least one temperature sensor that measures a wet bulb temperature of outside air, and at least one controller. At least one of the air channeling sub-systems includes an outside air damper operable to allow outside air into the air channeling sub-system. The at least one controller at least partially opens the outside air damper if a wet bulb temperature measured at the at least one temperature sensor drops to or below a predetermined temperature.

In some embodiments, the air channeling sub-system includes a return air damper. The at least one controller may substantially fully close the return air damper if the wet bulb temperature of outside air measured at the at least one temperature sensor drops to or below the predetermined temperature and substantially fully open the outside air damper if a wet bulb temperature of outside air measured in the at least one temperature sensor drops to or below the predetermined temperature.

In certain embodiments, air flow in an air channeling sub-system may be separated into two or more flow regions or vanes. In certain embodiments, an air channeling sub-system 30 includes a mixing chamber. The mixing chamber may mix outside air with air returned from the electronic equipment.

In one embodiment, a method of cooling electronic components in a room includes providing an air channeling sub-system. Air is received from the room into the air channeling sub-system. At least a portion of the air from the room is channeled through the air channeling sub-system and into the room. A wet bulb temperature of outside air is measured. If the wet bulb temperature of outside air drops to or below a predetermined temperature, an outside air damper is at least partially opened to allow outside air to into the air channeling sub-system. At least a portion of the outside air is channeled through the air channeling sub-system and into the room.

In one embodiment, a cooling system includes two or more air channeling sub-systems that provide cooling air to electronic equipment, at least one heat removal sub-system that removes heat from the air in at least one of the air channeling sub-systems, at least one sensor that measures at least one characteristic of outside air, and at least one controller. At least one of the air channeling sub-systems includes an outside air damper to selectively allow outside air into the air channeling sub-system. The at least one controller at least partially opens the outside air damper of at least one of the air channeling sub-systems based on the at least one predetermined characteristic of the outside air.

In one embodiment, a method of cooling electronic components in a room includes providing two or more air channeling sub-systems. At least one of the air channeling sub-systems include outside air dampers. Air is channeled through the air channeling sub-systems and into the room. At least one characteristic of outside air is measured. Outside dampers in each of at least one of the air channeling sub-systems are selectively positioned to achieve a desired level of cooling. The position of at least one of the outside dampers may be at least partially based on the at least one characteristic of the outside air.

In some embodiments, outside air dampers for some air channeling sub-systems are placed in an open position and outside air dampers for other air channeling sub-systems are placed in a closed position to achieve a desired level of cooling.

In certain embodiments, some air channeling sub-systems in a system may be placed in a free cooling mode. For each air channeling sub-system in the free cooling mode, the outside air damper may be opened and the heat removal sub-system may be deactivated. Other air channeling sub-systems in the system may remain in a normal mode.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Figure 1:
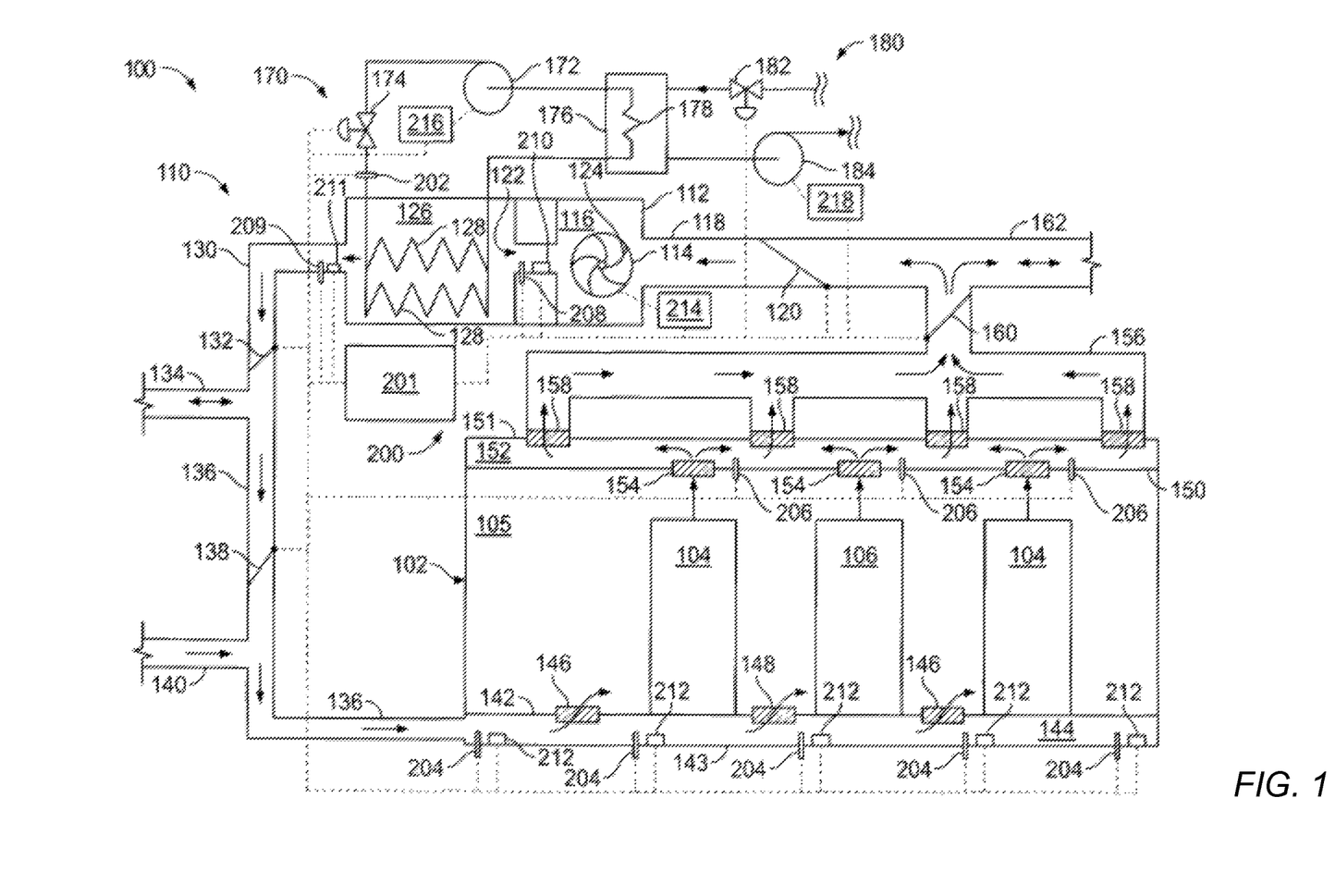
FIG. 1 is a schematic view of an exemplary data center cooling system.

FIG. 1 is a schematic view of an exemplary data center cooling system 100. System 100 is configured to remove waste heat generation from a data center 102. Data center 102 includes at least one high-density equipment rack system, or high-density rack 104, and at least one low-density equipment rack system, or low-density rack 106. Racks 104 and 106 are substantially similar with the exception of a configuration of electronic components (not shown) within each of racks 104 and 106 and the associated waste heat generation. Typically, waste heat generation from high-density rack 104 is greater than waste heat generation from low-density rack 106 due to the greater concentration of waste heat sources within rack 104 as compared to rack 106. Racks 104 and 106 are positioned within a room 105 of data center 102.

System 100 includes a fluid transport sub-system that, in the exemplary embodiment, is an air handling sub-system 110. Sub-system 110 is coupled in flow communication with data center 102 and includes at least one air handler 112. In the exemplary embodiment, sub-system 110 is configured to channel approximately 1,332 cubic meters of air per minute ($m^3$/min) (approximately 47,000 cubic feet per minute ($ft^3$/min). Air handler 112 includes at least one air pump, or fan 114 and a fan compartment 116 wherein fan 114 is positioned within compartment 116. Compartment 116 is coupled in flow communication with at least one air handler suction duct 118. Duct 118 includes at least one isolation damper 120 that is configured to isolate air handler 112 from the remainder of sub-system 110 in the event that such isolation is needed for situations that include, but are not, limited to, maintenance activities. Fan 114 includes a volute 122 and a plurality of fan blades 124 wherein volute 122 is configured to receive air discharged from blades 124. Air handler 112 also includes at least one heat exchange compartment 126 wherein a plurality of heat transfer conduits, or tubes 128, are positioned within. Compartment 126 is coupled in flow communication with compartment 116 such that air discharged from fan 114 is channeled across tubes 128. Tubes 128 are configured to facilitate heat removal from air channeled through compartment 126.

Air handling sub-system 110 also includes an air handler air discharge duct 130 that is coupled in flow communication with air handler 112. Duct 130 includes at least one air handler discharge duct damper 132 that is substantially similar to damper 120 in construction and purpose. Duct 130 is coupled in flow communication with at least one crossover duct 134 that is further coupled in flow communication with other data centers (not shown) similar to data center 102 and/or other air handling sub-systems (not shown) similar to sub-system 110. Sub-system 110 further includes at least one data center supply duct 136 that is coupled n flow communication with ducts 130 and 134 as well as data center 102. Duct 134 includes at least one damper 138 that is configured to isolate data center 102 from sub-system 110. Duct 136 is also coupled in flow communication with at least one outside air supply duct 140 that is configured to channel outside air into duct 136. In the exemplary embodiment, duct 140 is coupled in flow communication to an air handler (not shown) that is similar to air handler 112.

Data center 102 further includes a raised floor 142 that at least partially forms room 105. Data center 102 also includes a lower floor 143 that cooperates with floor 142 to at least partially form a data center air supply plenum 144. Floor 142 is configured to support data center components that are positioned within room 105 that include, but are not limited to, racks 104 and 106. At least one high-density air flow restriction device 146 is positioned within floor 142 and is configured such that a first predetermined rate of air flow at a first predetermined velocity is facilitated to impinge on each of racks 104. Similarly, at least one low-density air flow restriction device 148 is positioned within floor 142 and is configured such that a second predetermined rate of air flow at a second predetermined velocity is facilitated to impinge on each of racks 106. Devices 146 and 148 facilitate coupling plenum 144 in flow communication with room 105. In the exemplary embodiment, devices 146 and 148 are gratings fabricated to facilitate attaining the associated predetermined air flows and velocities. Alternatively, devices 146 and 148 are any devices that facilitate operation of system 100 as described herein, including, but not limited to, perforated floor tiles wherein such perforations are dimensioned and positioned to attain the associated predetermined air flows and velocities. Also, in the exemplary embodiment, racks 104 and 106 are configured to facilitate channeling heat-removing air flow into and throughout racks 104 and 106 from devices 146 and 148, respectively. Air flow is channeled such that substantially all of the waste heat generated by racks 104 and 106 is channeled out of racks 104 and 106 through the associated tops of racks 104 and 106.

Data center 102 also includes a drop ceiling 150 that at least partially forms room 105. Data center 102 further includes an upper ceiling 151 that cooperates with drop ceiling 150 to at least partially form a data center overhead air discharge plenum 152. A plurality of overhead air flow restriction devices 154 are positioned within ceiling 150 over racks 104 and 106, respectively. In the exemplary embodiment, the overhead devices are ceiling vents 154. Vents 154 facilitate coupling room 105 in flow communication with plenum 152 and each of vents 154 are substantially similar and are configured to channel substantially the same air flow. Alternatively, each of vents 154 are permanently configured to channel differing warm air flows in a manner similar to configuring devices 146 and 148 as described above. Further, alternatively, each of vents 154 are configured to be manually or automatically adjusted to vary air flow.

Sub-system 110 also includes a data center discharge duct 156 coupled in flow communication with plenum 152 via a plurality of air flow restriction devices 158. Devices 158, in the exemplary embodiment, are substantially similar to vents 154. Alternatively, each of devices 158 are permanently configured to channel differing warm air flows in a manner similar to configuring devices 146 and 148 as described above. Further, alternatively, each of devices 158 are configured to be manually or automatically adjusted to vary air flow. Duct 156 includes at least one isolation damper 160 that is similar to damper 138 in configuration and purpose. Duct 156 is coupled in flow communication to duct 118 and to at least one cross-over duct 162 that is coupled in flow communication with other data centers (not shown) similar to data center 102 and/or other air handling sub-systems (not shown) similar to sub-system 110.

Data center cooling system also includes a chilled water sub-system 170 coupled in heat transfer communication with sub-system 110. Sub-system 170 includes at least one pump 172 coupled in flow communication with a flow control valve 174. Valve 174 is coupled in flow communication with tubes 128 such that chilled water flow through tubes 128 is facilitated while air flows across tubes 128. Tubes 128 are coupled in flow communication with at least one chilled water heat exchanger 176 via a plurality of tubes 178 that are coupled in flow communication with pump 172.

Data center cooling system 100 further includes a chilled water heat removal sub-system 180. In the exemplary embodiment, sub-system 180 is a service water sub-system 180 that includes, but is not limited to, a flow control valve 182 coupled in flow communication with at least one pump 184 via heat exchanger 176. Alternatively, sub-system 180 may be any sub-system that facilitates operation of system 100 that includes, but is not limited to, an air-conditioning refrigerant sub-system and a cooling tower sub-system (neither shown). Sub-system 180 is coupled in heat transfer communication with sub-system 170 via heat exchanger 176 wherein service water flows over the outside of tubes 178 while chilled water flows within tubes 178. Alternatively, the fluid associated with sub-system 180 flows within tubes 178 while the fluid associated with sub-system 170 flows over the surface of tubes 178.

Data center cooling system 100 also includes a control sub-system 200. Sub-system 200 is configured to sense and measure a plurality of environmental parameters and modulate a differential temperature across each of racks 104 and 106.

As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits (neither shown in FIG. 1), and these terms are used interchangeably herein. In the exemplary embodiment, memory may include, but is not limited to, a computer-readable medium, such as a random access memory (RAM) (neither shown in FIG. 1). Alternatively, a floppy disk, a compact disc—read only memory (CD-ROM), a magneto-optical disk (MOD), and/or a digital versatile disc (DVD) (neither shown in FIG. 1) may also be used. Also, in the exemplary embodiment, additional input channels (not shown in FIG. 1) may be, but not be limited to, computer peripherals associated with an operator interface such as a mouse and a keyboard (neither shown in FIG. 1). Alternatively, other computer peripherals may also be used that may include, for example, but not be limited to, a scanner (not shown in FIG. 1). Furthermore, in the exemplary embodiment, additional output channels may include, but not be limited to, an operator interface monitor and/or a printer (neither shown in FIG. 1).

Processors (not shown) for sub-system 200, process information, including input environment measurement data. RAM and storage devices store and transfer information and instructions to be executed by the processor. RAM and storage devices can also be used to store and provide temporary variables, static (i.e., non-changing) information and instructions, or other intermediate information to the processors during execution of instructions by the processors. Instructions that are executed include, but are not limited to, resident averaging and forecasting algorithms. The execution of sequences of instructions is not limited to any specific combination of hardware circuitry and software instructions.

Sub-system 200 includes at least one PLC 201. PLC 201 is configured to operate dampers 120, 132, 138, and 160. In the exemplary embodiment, PLC 201 opens and closes dampers 120, 132, 138, and 160 based upon command signals from an operator to channel air flow through data center 102 as necessary for the prevailing operational conditions. Open and close control signals and damper position feedback signals are illustrated with the associated dashed lines. Alternatively, PLC 201 modulates dampers 120, 132, 138, and 160 between fully open and fully closed positions to modulate air flow.

Sub-system 200 also includes a plurality of temperature measurement devices that, in the exemplary embodiment, are thermocouples. Alternatively, the temperature measurement devices include, but not be limited to, resistance temperature detectors (RTDs) and any device that facilitate operation of sub-system 200 as described herein. At least one chilled water thermocouple 202 is positioned within sub-system 170 to facilitated measuring a temperature of the chilled water upon discharge from heat exchanger 176. In the exemplary embodiment, such chilled water temperatures are controlled to approximately 5.6 degrees Celsius (° C.) (42 degrees Fahrenheit (° F.)).

Sub-system 200 further includes at least one thermocouple 204 positioned within plenum 144 that is configured to facilitate measuring a temperature of air within plenum 144 prior to being channeled towards racks 104 and 106. In the exemplary embodiment, a plurality of thermocouples 204 are positioned approximately 3 meters (m) (10 feet (ft)) apart to facilitate measurement redundancy and measurement averaging across plenum 144. Alternatively, any number of thermocouples 206 positioned anywhere within plenum 144 that facilitates operation of system 100 as described herein is used.

Sub-system 200 also includes at least one thermocouple 206 positioned within plenum 152 that is configured to facilitate measuring a temperature of air within plenum 152 subsequent to being channeled from racks 104 and 106. In the exemplary embodiment, a plurality of thermocouples 206 are positioned approximately 3 meters (m) (10 feet (ft)) apart to facilitate redundancy and measurement averaging in a manner similar to that used with thermocouples 204 within plenum 144. Alternatively, any number of thermocouples 206 positioned anywhere within plenum 152 that facilitates operation of system 100 as described herein is used.

Sub-system 200 further includes at least one thermocouple 208 and pressure transmitter 210 positioned within fan volute 122 that are configured to facilitate measuring a temperature and a pressure, respectively, of air being discharged by fan 114. Moreover, sub-system 200 includes at least one thermocouple 209 and pressure transmitter 211 positioned within duct 130, as close to compartment 126 as practical, that are configured to facilitate measuring a temperature and a pressure, respectively, of air being discharged from compartment 126. Thermocouples 208 and 209 and pressure transmitters 210 and 211 are used to facilitate separating dynamic effects from static effects during tuning activities of sub-system 200 during commissioning, thereby facilitating tuning dynamic control responses out of sub-system 200.

Sub-system 200 also includes at least one pressure transmitter 212 positioned within plenum 144 that is configured to facilitate measuring a pressure of air within plenum 144 prior to being channeled towards racks 104 and 106. In the exemplary embodiment, a plurality of pressure transmitters 212 are positioned approximately 3 meters (m) (10 feet (ft)) apart to facilitate redundancy and measurement averaging in a manner similar to that used with thermocouples 204 within plenum 144. Alternatively, any number of pressure transmitters 212 positioned anywhere within plenum 144 that facilitates operation of system 100 as described herein is used.

Thermocouples 202, 204, 206 and 208 as well as pressure transmitters 210 and 212 are coupled in electronic data communication with PLC 201 as illustrated by the associated dashed lines in FIG. 1. Moreover, PLC 201 is configured to receive electronic data signals from such thermocouples 202 to 208 and transmitters 210 and 212.

Sub-system 200 further includes a variable frequency drive (VFD) 214 coupled in electronic data communication with PLC 201. VFD 214 is coupled to a prime mover (not shown) of fan 114. Moreover, VFD 214 is configured to receive control signals from PLC 201 and subsequently modulate a rotational velocity of blades 124 such that air flow through sub-system 110 is also modulated. As discussed above, in an alternative embodiment, dampers 120, 132, 138 and 160 may also be modulated via PLC 201 to modulate air flow through sub-system 110.

Sub-system 200 also includes a VFD 216 coupled to a prime mover (not shown) of pump 172. VFD 216 is coupled in electronic data communication with PLC 201 and is configured to receive control signals from PLC 201 and subsequently modulate a rotational velocity of pump 172 such that chilled water flow through sub-system 170 is modulated. In the exemplary embodiment, PLC 201 is also coupled in electronic data communication with valve 174 wherein valve 174 is configured to receive control signals from PLC 201 to modulate a position of valve 174 between fully open and fully closed positions wherein chilled water flow is modulated. Alternatively, only one of pump 172 or valve 174 are modulated via PLC 201.

Sub-system 200 further includes a VFD 218 coupled to a prime mover (not shown) of pump 184. VFD 218 is coupled in electronic data communication with PLC 201 and is configured to receive control signals from PLC 201 and subsequently modulate a rotational velocity of pump 184 such that service water flow through sub-system 180 is modulated. In the exemplary embodiment, PLC 201 is also coupled in electronic data communication with valve 182 wherein valve 182 is configured to receive control signals from PLC 201 to modulate a position of valve 182 between fully open and fully closed positions wherein service water flow is modulated. Alternatively, only one of pump 184 or valve 182 are modulated via PLC 201.

In the exemplary embodiment, VFDs 214, 216, and 218 use pulse width modulation (PWM) methods as are know in the art to modulate the rotational velocity of the associated prime movers. Alternatively, any method of modulation of fan 114 and pumps 172 and 184 that facilitates operation of system 100 as described herein is used. Furthermore, PLC 201 is configured with at least one algorithm to receive the aforementioned pressure and temperature measurement signals and modulate VFDs 214, 216 and 218 as well as valves 174 and 182 to maintain a predetermined differential temperature across racks 104 and 106.

Figure 2:
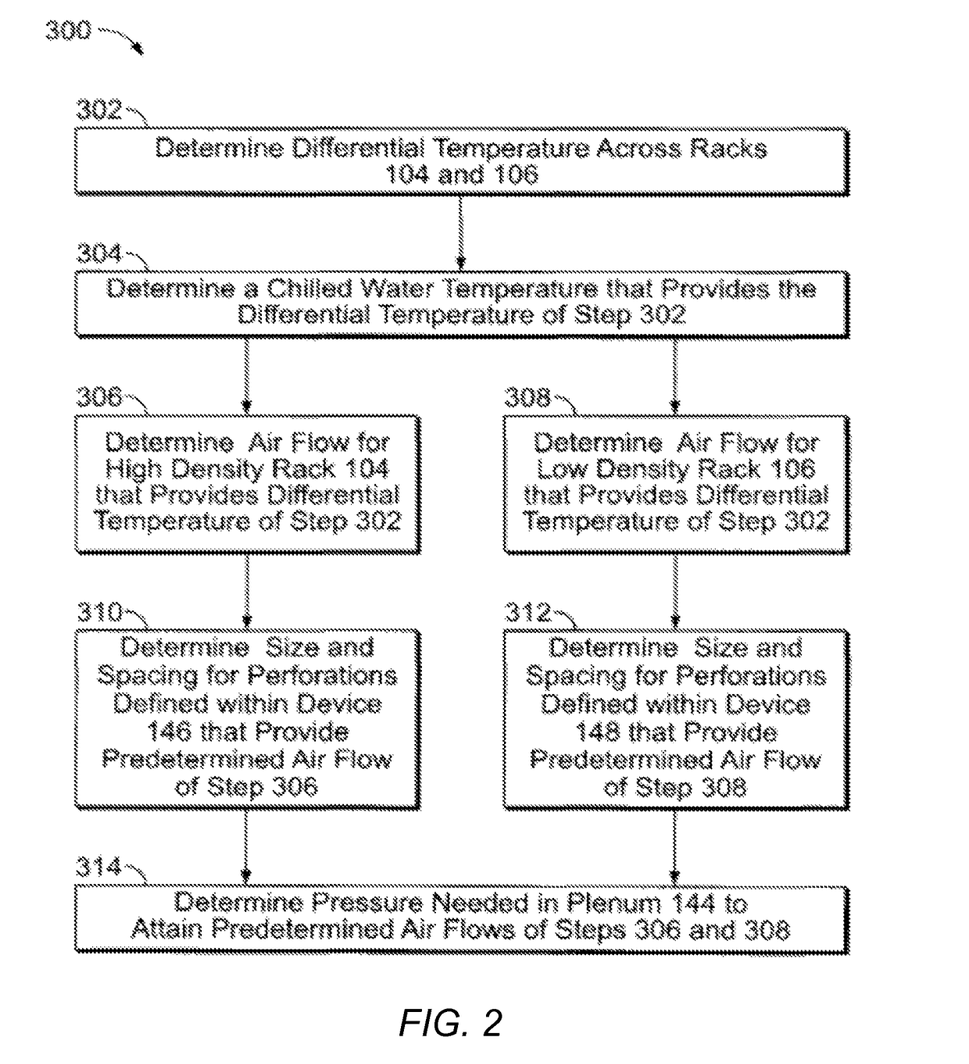
FIG. 2 is a block diagram illustrating a method of determining at least one air flow that can be used with a data center cooling system.

FIG. 2 is a block diagram of a method 300 of determining at least one air flow that can be used with data center cooling system 100 (shown in FIG. 1). Method 300 includes determining 302 a differential temperature that should be maintained across racks 104 and 106. Typically, such determinations use technical information that includes, but is not limited to, manufactures specifications and anticipated utilization of the equipment. In the exemplary embodiment, such predetermined differential temperatures are substantially similar for both racks 104 and 106. Alternatively, differing racks have differing predetermined differential temperatures. Moreover, in the exemplary embodiment, the predetermined differential temperatures across racks 104 and 106 is approximately 22° C. (40° F.). In operation, such differential temperatures are calculated based on temperatures sensed and measured using thermocouples 204 and 206.

Method 300 also includes determining 304 a chilled water temperature that provides the predetermined differential temperatures across racks 104 and 106. Determining 304 such chilled water temperatures is accomplished using heat transfer algorithms known in the art. In the exemplary embodiment, such temperature is approximately 5.6° C. (42° F.). In operation, such chilled water temperatures are sensed and measured using thermocouple 202.

Method 300 further includes determining 306 an air flow for rack 104 that provides the predetermined differential temperatures of step 302. Determining 306 the air flow is typically performed using heat transfer algorithms known in the art. In the exemplary embodiment, step 306 provides a predetermined air flow for rack 104 that is approximately 11.3 m$^3$/min (400 ft$^3$/min). Method 300 also includes determining 308 an air flow for rack 106 that is substantially similar to step 306. In the exemplary embodiment, step 308 provides a predetermined air flow for rack 106 that is approximately 22.6 m$^3$/min (800 ft$^3$/min).

Method 300 further includes determining 310 a size and spacing for perforations defined within device 146 that provide the predetermined air flow from step 306. Determining 310 the details of the perforations within 146 is typically performed using algorithms know in the art. Method 300 also includes determining 312 a size and spacing for perforations defined within device 148 that provide the predetermined air flow from step 308 that is substantially similar to step 310.

Method 300 further includes determining 314 a pressure that is needed within plenum 144 to attain the predetermined air flows of steps 306 and 308. Determining 314 such pressure needed in plenum 144 is performed using algorithms known in the art. Moreover, in operation, such pressures are sensed and measured using pressure transmitters 212.

A method of cooling high-density racks 104 and low-density racks 106 is provided. The method includes providing an air handling sub-system 110. The method also includes channeling at least a portion of air towards racks 104 and 106. The method further includes configuring control sub-system 200 to facilitate substantially maintaining at least a portion of air handling sub-system 110 at a predetermined pressure.

The apparatus and method described above facilitates reducing installation costs of system 100 by eliminating expensive components, for example, variable air volume (VAV) controllers, that are replaced by PLCs and VFDs that are typically off-the-shelf stock items. Moreover, such PLCs and VFDs configured in a relatively simple control scheme facilitates reduced post-installation maintenance costs. Furthermore, such configurations facilitate reduced operational costs due at least in part to reduced electrical power usage.

In operation and referring to FIG. 1, fan 114 takes suction on air from duct 118 as illustrated by arrows. Fan 114 discharges air through volute 122 and subsequently into compartment 126 wherein air passes over tubes 128 and is cooled. In the exemplary embodiment, the temperature of air discharged from compartment 126 is typically less than 10° C. (50° F.) such that some heat absorption by air during transit to plenum 144 is accounted for. Such air temperatures are at least partially determined via method 300. Cooled air is channeled into duct 130 wherein it may be further channeled to a data center (not shown) by duct 134 or channeled to duct 136. A secondary source of air, for example, outside air, may be channeled into duct 136 from 140 to provide make-up air for typical operational losses and facilitate maintaining the quality of air within data center 102 within predetermined parameters. Moreover, in an emergency, for example, when air-handler 112 is out of service, 100% of the cooling air needed to place data center 102 in a stable condition can be introduced into data center 102. Typically, during warmer periods, introduction of outside make-up air via duct 140 is substantially reduced to near zero to mitigate humidity of air within sub-system 110. Otherwise, during cooler periods, a make-up rate that provides approximately 10% of the air within sub-system 110 is used. In the event that make-up air temperature diverges from compartment 126 air discharge temperature, the temperature of air channeled from compartment 126 is adjusted appropriately as described below.

Air is channeled from duct 136 into plenum 144 such that a predetermined substantially static pressure is maintained within plenum 144. Such static pressure is determined via method 300 as described above. Air is then channeled upward from plenum 144 through devices 146 and 148, wherein devices 146 and 148 facilitate channeling predetermined air flows that impinge on racks 104 and 106. Such air flows and associated configurations of devices 146 and 148 are determined using method 300 as described above. In the exemplary embodiment, the temperature of air discharged from plenum 144 is approximately 10° C. (50° F.).

Air is subsequently channeled across and through racks 104 and 106 wherein the air absorbs at least some of the waste heat generated within racks 104 and 106. Warmed air is channeled upward from racks 104 and 106 through vents 154 into plenum 152, wherein the warmed air is at least partially mixed. Air is channeled from plenum 152 into duct 156, wherein duct 156 facilitates further mixing. The warmed air is subsequently channeled into duct 118 for another transit through sub-system 110 and/or channeled to another air handler via duct 162.

Also, in operation, chilled water pump 172 channels chilled water from heat exchanger 176 to tubes 128 within compartment 126 via flow control valve 174. Chilled water within tubes 128 absorbs heat from air being channeled through compartment 126 over tubes 128. Warmed water is subsequently channeled to heat exchanger 176 wherein heat is transferred from chilled water within tubes 178 into service water flowing around tubes 178. Service water is channeled from heat exchanger 176 to pump 184 wherein it is further channeled to flow control valve 182 via and back to heat exchanger 176.

Further, in operation, PLC 201 receives a plurality of temperature measurement signals from thermocouples 202, 204, 206 and 208. PLC 201 also receives a plurality of pressure measurement signals from pressure transmitters 210 and 212. In the exemplary embodiment, an independent rack differential temperature control scheme and an independent inlet plenum pressure control scheme (neither shown) are configured within PLC 201. The differential temperature control scheme and the inlet plenum pressure control scheme have no direct co-dependencies that include, but are not limited to, feed forward features. Separating the two control schemes facilitates mitigating conflicting control actions from forming instabilities within system 100. Alternatively, the differential temperature and the inlet plenum pressure control schemes are directly interfaced to each other such that control of one directly affects the control of the other.

In operation, the differential temperature control scheme configured within PLC 201 facilitates receipt of cool air temperature measurement signals from thermocouples 204 and warm air temperature measurement signals from thermocouples 206. The scheme also facilitates determining a differential temperature based on the measurement signals from thermocouples 206 and 204 via at least one algorithm. In the exemplary embodiment, the differential temperature is controlled to approximately 22.2° C. (40° F.) and the inlet plenum air temperature is controlled to approximately 10° C. (50° F.). Therefore, the outlet plenum temperature is controlled to approximately 32.2° C. (90° F.). To maintain these temperatures and differential temperature, in the exemplary embodiment, chilled water temperature at an inlet to tubes 128 is maintained at approximately 5.6° C. (42° F.).

In the exemplary embodiment, in the event that the differential temperature across racks 104 and 106 increases beyond 22.2° C. (40° F.), PLC 201 issues a command signal via the differential temperature control scheme to VFD 216 to increase a speed of the prime mover driving pump 172. Alternatively, PLC 201 issues a command signal via the differential temperature control scheme to valve 174 to move in the open direction. The increased speed of pump 172 and revised valve 174 position are determined via at least one algorithm configured within PLC 201. Chilled water flow is increased through tubes 128, thereby increasing the rate of heat removal from air within compartment 126 and subsequently decreasing the temperature of air transiting to plenum 144 via ducts 130 and 136. PLC 201 will modulate VFD 216 and/or valve 174 position as necessary to return the differential temperature across racks 104 and 106 to a static approximately 22.2° C. (40° F.). Furthermore, the additional heat loading of chilled water subsystem 170 is controlled as well by accelerating pump 184 via signals received by VFD 218 from PLC 201 and/or opening valve 182 via signals received from PLC 201 such that a chilled water temperature of approximately 5.6° C. (42° F.) at an inlet to tubes 128 is maintained.

Also, in the exemplary embodiment, in the event that the static pressure of plenum 144 as sensed and measured by transmitters 212 decreases below the predetermined value, PLC 201 via the pressure control scheme receives the pressure measurement signals and uses at least one algorithm determine a revised speed of fan 114. PLC 201 issues a command signal via the pressure control scheme to VFD 214 to increase a speed of the prime mover driving fan 114. PLC 201 will modulate VFD 214 as necessary to return the pressure within plenum 144 to the static predetermined value.

The method and apparatus for cooling electronic components as described herein facilitates reducing costs of a data center cooling system. Specifically, replacing relatively high-cost components with low-cost components facilitates reducing installation costs. Moreover, replacing relatively fragile components with field-rugged components facilitates reducing maintenance and replacement costs. Furthermore, using a static control scheme facilitates reducing operating costs.

Figure 3:
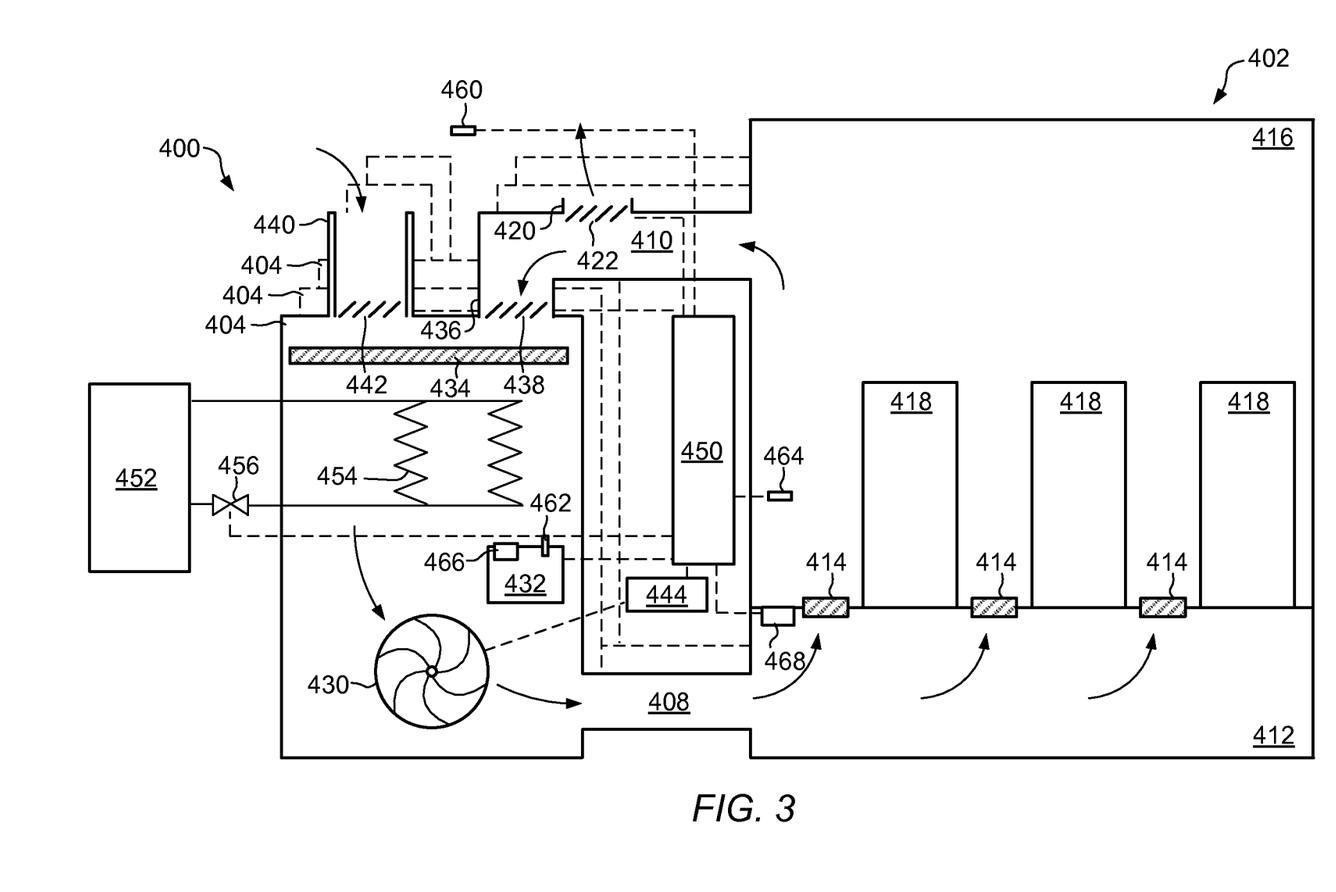
FIG. 3 is a schematic diagram illustrating one embodiment of a data center cooling system including an outside air damper and a return air damper.

FIG. 3 is a schematic view of another embodiment of a data center cooling system. Cooling system 400 may remove heat from data center 402. In the embodiment illustrated in FIG. 3, cooling system 400 includes air handling sub-systems 404. Air handling sub-systems 404 may provide cooling air to data center 402.

For illustrative purposes, three air handling sub-systems 404 are shown in FIG. 3 (for clarity, details of only the front air handling sub-system 404 are shown). The number of air handling sub-systems 404 in cooling system 400 may vary, however. In some embodiments, cooling system 400 includes many air handling sub-systems 404. In one embodiment, cooling system 400 may include 18 air handling sub-systems 404. In another embodiment, cooling system 400 includes only one air handling sub-system 404. In facilities with multiple air handling sub-systems and/or multiple data centers, cross-over ducts may be provided (e.g., on the supply side, the return side, or both) to allow cooling air from air handling sub-systems to be distributed and/or redirected within a data center or among data centers. Air handling sub-systems may be commonly controlled, separately controlled, or a combination thereof. In certain embodiments, only a sub-set of the total air handling sub-systems for a data center are provided with outside air vents. For example, half the air handling systems at a data center may have both outside air vents and return air vents, while the other half the air handling systems at a data center have only return air vents.

Each air handling sub-system 404 may be coupled to data center 402 by supply duct 408 and return duct 410. Cooling air may flow from air handling sub-system 404 through supply duct 408 into plenum 412. From plenum 412, cooling air may pass through flow restriction devices 414 into room 416. Cooling air may pass over racks 418. After the air is heated by racks 418, the air may pass through return duct 410. Air may be recirculated through one or more air handling sub-systems or discharged from the system through exhaust vent 420. Exhaust vent 420 includes exhaust damper 422.

Air handling sub-system 404 includes fan 430, humidifier 432, filter 434, return air vent 436, return air damper 438, outside air vent 440, and outside air damper 442. Fan 430 is coupled to VFD 444. VFD 444 is coupled to control unit 450. Control of fan 430 may be, for example, as described above relative to FIG. 1. Return air vent 438 may receive air returning from data center 102 through return duct 410. Outside air vent 440 may receive outside air.

Cooling system 400 includes chilled water subsystems 452. Chilled water subsystems 452 may be coupled in heat transfer communication with air handling sub-systems 404. Chilled water sub-system 452 includes coils 454 and valve 456. Valve 456 is coupled to control unit 450. Valve 456 may be opened and closed by signals from control unit 450. The position of valve 456 may be used to regulate the use of chilled water to cool air in air handling sub-system 404. Chilled water sub-system 452 may be similar to chilled water sub-system 170 described relative to FIG. 1. In one embodiment, a common chilled water subsystem 452 provides chilled water to two more of air handling sub-systems 404. In certain embodiments, each air handling sub-system 404 is cooled by a dedicated chilled water subsystem 452.

In some embodiments, chilled water subsystems 452 may be coupled to a chilled water heat removal system. Examples of chilled water heat removal systems include a service water subsystem, air-conditions refrigerant sub-system, or a cooling tower sub-system. In one embodiment, chilled water heat removal system is as described above relative to FIG. 1.

Control unit 450 may be programmed to control devices in handling sub-systems 404 and/or chilled water sub-systems 452. Control unit 450 is coupled to fan 430, humidifier 432, return air damper 438, outside air damper 442, and exhaust damper 422. Control unit 450 is in data communication with temperature sensors 460, 462, and 464 and pressure sensors 466 and 468. In one embodiment, all of air handling sub-systems 404 and chilled-water sub-systems are controlled with a common control unit (e.g., control unit 450). In other embodiments, separate controllers are provided for each air handling sub-system 404 and chilled water sub-systems 452, or for a subset of the air handling sub-systems 404 and/or chilled water sub-systems 452. Devices in air handling sub-systems 404 and chilled water sub-systems 452 may be controlled automatically, manually, or a combination thereof.

In the embodiment shown in FIG. 3, air handling sub-system 404 may force air through supply duct 408 into plenum 412. In other embodiments, cooling air may be forced directly into room 416 through a supply duct without going through a plenum. In various embodiments, flow restriction devices 414 may be chosen to control the flow rates and distribution of cooling air among various racks 418 in room 416, such as described relative to FIGS. 1 and 2.

In various embodiments, operation of one or more air handling sub-systems of a cooling system may be controlled in response to one or more conditions. For example, the controller may be programmed to switch the air source for an air-handling sub-system from return air to outside air when one or more predetermined conditions are met, such as temperature and humidity.

In some embodiments, the air source for one or more air handler units can be switched from return air to outside air, and a chilling system for the air handling sub-system can be de-staged (e.g., the flow of chiller water to the air handling sub-system shut off), when predetermined conditions are met. As used herein, a "normal cooling mode" refers to a mode of operation in which an air handling sub-system passes air returned from a data center through a chiller sub-system and recirculates the air back to the data center. As used herein, "free cooling mode" refers to a mode of operation in which an air handling sub-system pulls air from an external source (e.g., air outside a facility) and forces the air to electronic equipment without active chilling in the air-handling sub-system (e.g., fluid flow through the chiller coils in the air handling sub-system is shut off by closing a flow control valve). Other modes of operation may be implemented in various embodiments. For example, in certain embodiments, chiller coils may be active in an air handling sub-system (e.g., circulating cooling fluid) when the air-handling sub-system is channeling outside air, or channeling a mixture of outside air and return air, such that outside air is cooled by the chiller coils before being channeled to the electronic equipment.

Figure 4A:
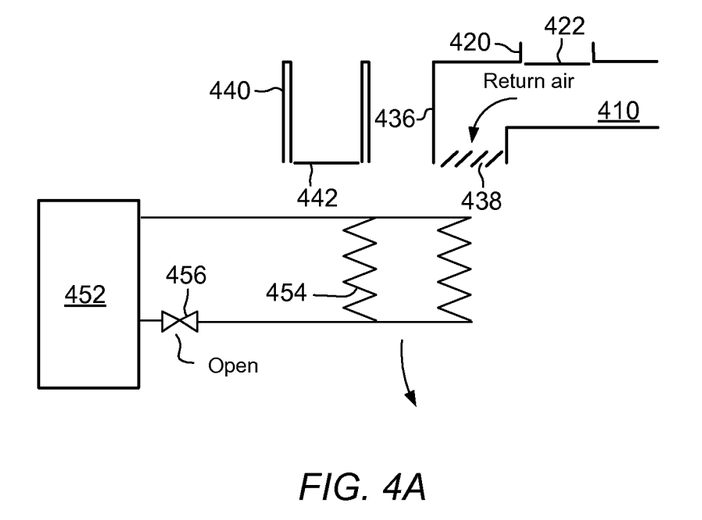
FIG. 4A is a schematic diagram illustrating one embodiment of a system in a normal cooling mode.
Figure 4B:
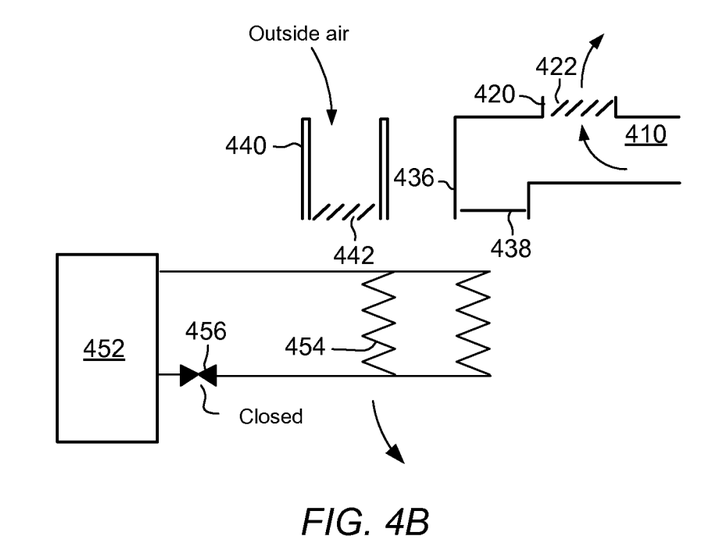
FIG. 4B is a schematic diagram illustrating one embodiment of a system in a free cooling mode.

FIG. 4A is a schematic diagram of one embodiment of a cooling air system in a normal cooling mode. FIG. 4B is a schematic diagram of one embodiment of a cooling air system in a free cooling mode. The elements shown in FIGS. 4A and 4B may be part of the system illustrated in FIG. 3.

In the embodiment of a normal cooling mode illustrated in FIG. 4A, outside air damper 442 and exhaust damper 422 are closed. Return air damper 438 is open. Valve 456 is open to allow chilled water to flow through coils 454. During operation in the normal cooling mode of the air handling system, air may pass through return vent 436, through return air damper 438 (now open) and pass over coils 454. Heat from the air may be rejected into fluid passing through the coils 454. The cooled air may be recirculated to a data center.

In the embodiment of a free cooling mode illustrated in FIG. 4B, outside air damper 442 and exhaust damper 422 are open. Return air damper 438 is closed. Valve 456 is closed to inhibit flow of chilled water through coils 454. During operation of the air handling system in the free cooling mode, air may be drawn from outside air vent 440, through outside air damper 442 (now open), and pass over coils 454, which are now inactive. Air may be channeled to room in a data center. Exhaust air from the data center may be discharged from the system through exhaust vent 420.

In certain embodiments, outside air may be introduced downstream from an air handling sub-system. For example, referring to the embodiment shown in FIG. 3, instead of outside air vent 440 and outside air damper 442, a system may include an outside air vent and outside air damper that is downstream from air handling sub-system 404. For such a system, during operating modes that use outside air, the outside air may be forced into plenum 412 by a separate fan.

Figure 5A:
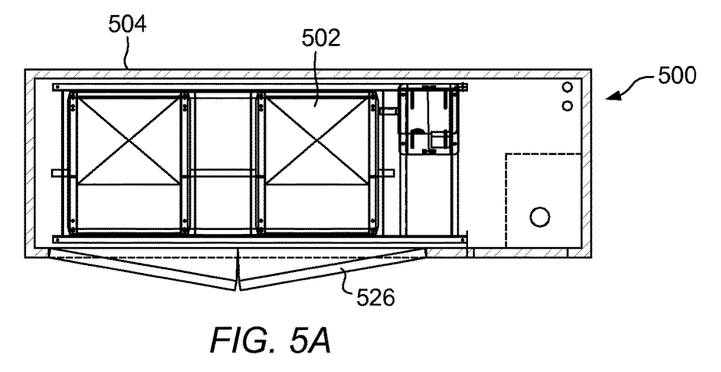
FIG. 5A is a top view of one embodiment of an air handling sub-system with an outside air vent and a return air vent.
Figure 5B:
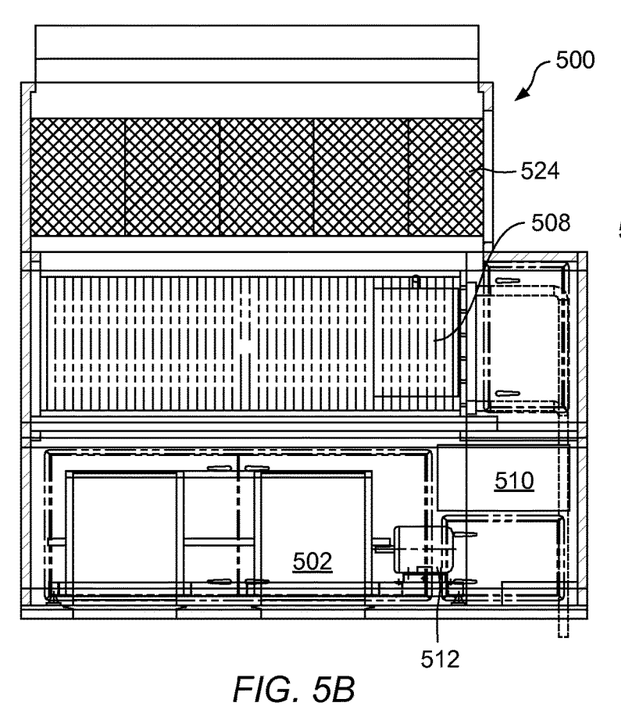
FIG. 5B is a front view of one embodiment of an air handling sub-system with an outside air vent and a return air vent.
Figure 5C:
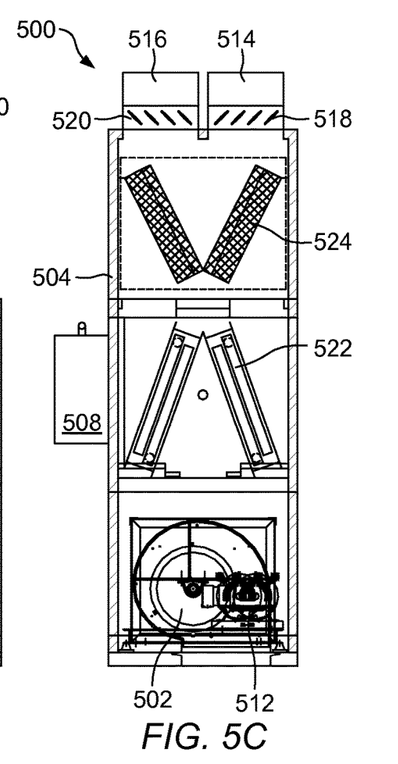
FIG. 5C is a side view of one embodiment of an air handling sub-system with an outside air vent and a return air vent.

An embodiment of an air handling system is illustrated in FIGS. 5A, 5B, and 5C. Air handling sub-system 500 includes fans 502, enclosure 504, humidifier 508, control cabinet 510, and motors 512. Control cabinet 510 may be recessed on one side of the enclosure. Control cabinet 510 may be insulated.

Return air vent 514 and outside air vent 516 are provided at the top of enclosure 504. Return air damper 518 is located in return air vent 514. Outside air damper 520 is located in outside air vent 516. Fans 502 are mounted near the bottom of enclosure 504. Motors 510 are operatively coupled to fans 502 and control cabinet 508. Chilled water cooling coil bank 522 is housed in enclosure 504 above fans 502. Filters 524 are installed above chilled water cooling coil bank 522. Chilled water cooling coil bank 522 and filters 524 may be installed at an angle with respect to the flow of air through enclosure 504.

Air handling sub-system 500 includes service doors 524. Service doors 524 may allow access to fans 502.

During operation of the air handling sub-system, motors 510 may be operated (e.g., by control unit 508) to drive fans 502. Air may be received through one or both of return air vent 514 and outside air vent 516. Fans 520 may draw the air over chilled water cooling coil bank 522. Fans 502 may force the air out through the bottom of enclosure 504.

Figure 6:
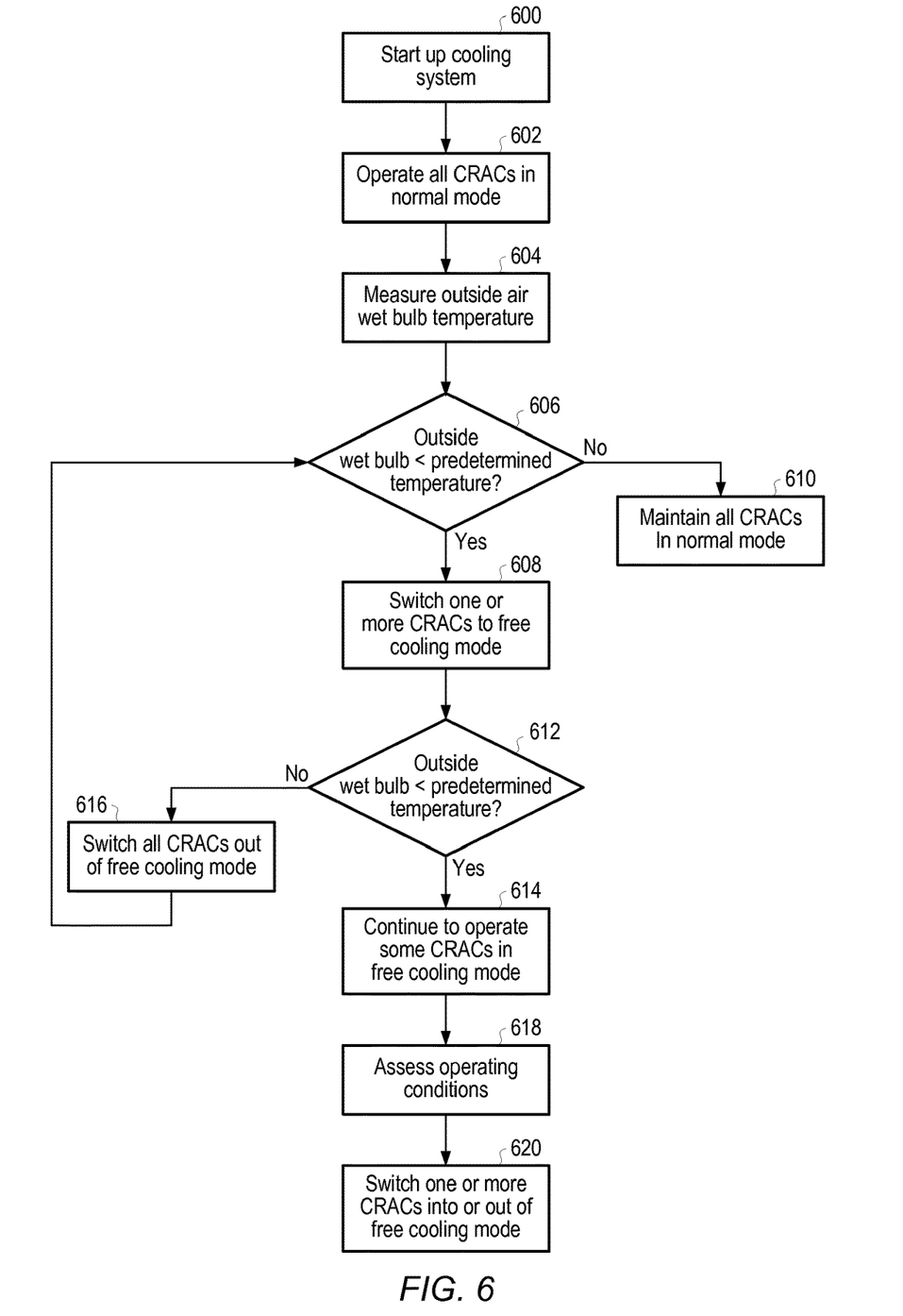
FIG. 6 is a flow diagram illustrating one embodiment of operating computer room air conditioning units.

One embodiment of a method of operating a cooling system for a data center is illustrated in FIG. 6. At 600, one or more chiller sub-systems and one or more computer room air conditioning units (CRACs) are started to provide cooling air to a data center. Initially, at 602, return air dampers in the CRACs may be placed in an open position to allow return air from the data center to be pulled across cooling coils and recirculated to the data center. The outside air dampers for the CRACs may be closed.

The cooling air from one or more CRACs may be regulated to achieve desired environmental conditions in the data center. In some embodiments, a predetermined pressure is maintained in the cooling air at (e.g., static pressure measured at plenum 144). For example, referring to FIG. 1, pressure in plenum 144 may be maintained based on a reading from pressure sensors 212 as described above relative to FIG. 1.

At 604, a wet bulb temperature of outside air is measured. Measurements may be taken on a continuous or at regular or non-regular intervals. In some embodiments, each CRAC has its own outside air wet bulb temperature sensor. In other embodiments, two or more CRACs are controlled based on measurement from a common temperature sensor. In certain embodiments, other characteristics, such as dry bulb temperature of the outside air or humidity, may be measured.

At 606, if the measured wet bulb temperature of the outside air is less than a predetermined temperature, one or more of the CRACs may be switched from a normal cooling mode to a free cooling mode at 608. The return air dampers in these CRACs may be closed and the outside air dampers opened in the CRACs. The chiller sub-system coupled to the CRACs may be disengaged (e.g., valve 456 closed so that cooling fluid does not flow through the cooling coils in the CRACs). If the wet bulb temperature of the outside air is above the predetermined temperature, all the CRACs may remain in a normal cooling mode at 610.

At 612, the wet bulb temperature of the outside air may continue to be measured as the system operates with some of the CRACs in free cooling mode. If the wet bulb temperature of the outside air rises above the predetermined temperature (e.g., it gets warmer and humid outside), all of the CRACs that are in free cooling mode may be switched back to normal mode at 616. If the wet bulb temperature of the outside air remains below the predetermined temperature (e.g., it stays cold and dry outside), some or all of the CRACs that are in free cooling mode may remain in free cooling mode at 614.

In one embodiment, the predetermined wet bulb temperature is about 55 degrees F. In some embodiments, the predetermined wet bulb temperature is between about 53 degrees F. and about 57 degrees F.

For any given embodiment, a predetermined temperature for switching from return air to outside air may be the same as, or different from, a predetermined temperature for switching back from outside air to return air. For example, in one embodiment, dampers may be switched from return air to outside air when the outside wet bulb temperature drops below 55 degrees F. If the outside air wet bulb temperature rises above 55 degrees F., the dampers may be switched back (i.e., from outside air to return air). In another embodiment, dampers may be switched from return air to outside air when the temperature drops below 55 degrees F., then remain in free cooling mode until the wet bulb air temperature of the outside air rises to above 58 degrees F.

At 618, operating conditions (e.g., temperatures inside the data center, temperatures outside) may be measured and assessed. At 620, additional units may be switched into or out of a free cooling mode. For example, on a cold day, it may be determined that more CRACs can be placed in free cooling mode.

In some embodiments, individual CRACs are selectively controlled to maintain operating conditions in the data center at a predetermined level or within a predetermined range. For example, operating conditions may be controlled to inhibit condensation in the data center. In one embodiment, CRACs are selectively switched into and out of free-cooling mode to maintain an air temperature in the data center (e.g., air temperature measured using temperature sensor 464 shown in FIG. 4) of about 76 degrees F. In one embodiment, CRACs are selectively switched into and out of free-cooling mode to maintain an air temperature in the data center of with a range of about 8 degrees (e.g., between about 72 degrees F. and about 80 degrees F.). For instance, if an air temperature in the data center rises above 80 degrees F., one or more CRACs may be switched from a free cooling mode to a normal mode. Conversely, if the air temperature in the data center falls below 72 degrees F., one or more CRACs that are operating in normal mode may be switched to free cooling mode.

In some embodiments of systems including CRACs, operation of one or more of the CRACs may be controlled to increase or decrease the total output of the cooling system. In certain embodiments, the number of units switched from normal to free cooling mode may be selected to achieve a desired level of cooling performance. For example, in a system with 18 CRACs, the system may be programmed so that only 8 of the CRACs switch to free cooling mode, while the other 10 remain in normal cooling mode.

In some embodiments, switching between outside air and return air and/or shut down of the chillers may be programmed to occur in stages. For example, in a system with a total of 16 CRACs, 4 CRACs may be switched from normal cooling mode to free cooling mode when the outside air wet bulb temperature drops to 55 degrees F., then another 4 CRACs may be switched from normal cooling mode to free cooling mode when the outside air wet bulb temperature drops to 52 degrees F., etc. As outside air wet bulb temperature rises, CRACs may be switched on and/or enabled sequentially in a similar manner. In certain embodiments, CRACs are de-staged one at a time.

In certain embodiments, a dry bulb temperature, humidity, and/or pressures may be used instead of, or in addition to, a wet bulb temperature to determine operating parameters (e.g., whether to operate an air handler unit in normal cooling mode or free cooling mode).

In some embodiments, air handling sub-systems may be used to remove smoke from a data center. In one embodiment, a system includes smoke detection devices in the data center. When smoke is detected by one of the devices, some or all of the air handling sub-systems are switched to outside air. Exhaust dampers may be opened to allow smoke to be purged or extracted from the data center. In one embodiment, all of air handling sub-systems that have outside air dampers are fully opened to remove smoke from the data center.

Figures 7, 8, 9:
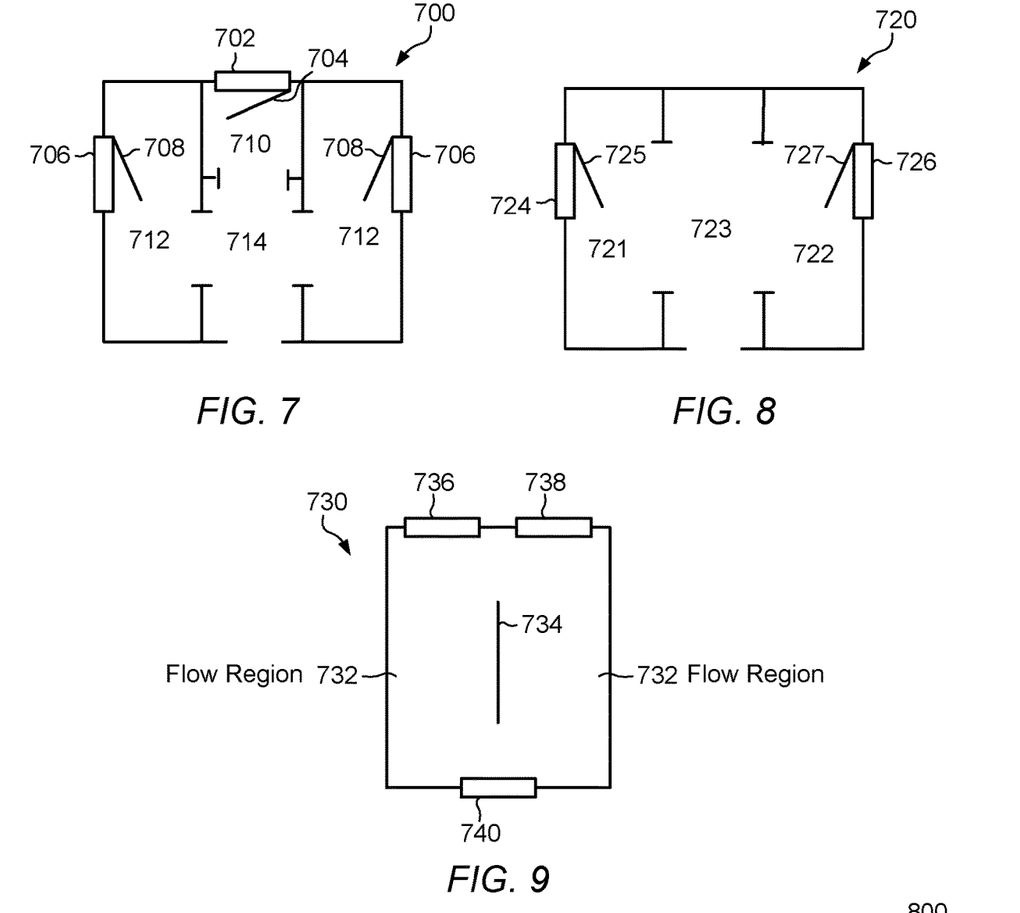
FIG. 7 is a schematic diagram illustrating one embodiment of an air handling sub-system including a mixing chamber.
FIG. 8 is a schematic diagram illustrating another embodiment of an air handling sub-system with a mixing chamber.
FIG. 9 is a schematic diagram of an air handling sub-system including segregated flow vanes.

In some embodiments, an air handling sub-system may be controlled to use a mixture of return air and outside air. The relative proportions of return air and outside air may be adjusted. Adjustments may be made based on characteristics of air inside or outside of the system. FIG. 7 is a schematic view illustrating one embodiment of an air handling sub-system with a mixing region.

Air handling sub-system 700 includes outside air vent 702, outside air damper 704, and return air vents 706, and return air dampers 708. Outside air may be received into chamber 710. Return air may be received in chambers 712. Air from chambers 710 and 712 may mix in mixing chamber 714. Mixed air from mixing chamber 714 may be drawn across a blower and channeled to electronic equipment.

FIG. 8 is a schematic view illustrating one embodiment of an air handling sub-system with a mixing region. Air handling sub-system 720 includes outside air vent 724, outside air damper 725, and return air vent 726, and return air damper 727. Outside air may be received into chamber 721. Return air may be received in chamber 722. Air from chambers 721 and 722 may mix in mixing chamber 723. Mixed air from mixing chamber 723 may be drawn across a blower and channeled to electronic equipment.

One embodiment of a cooling system including multiple flow vanes is illustrated in FIG. 9. System 730 includes flow vanes 732. Flow vanes 732 are separated by firewall 734. Air may enter through intake vents 736 and 738, pass through vanes 732, and exit through duct 740.

Figure 10:
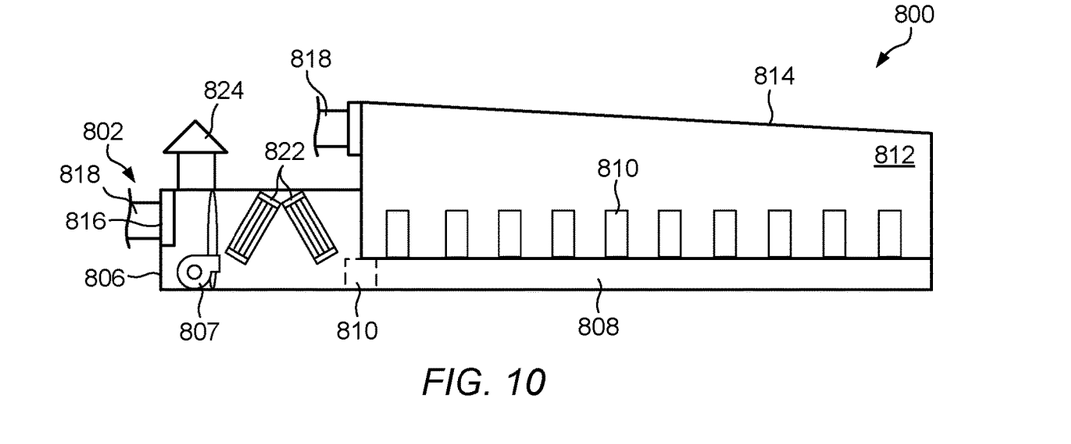
FIG. 10 is a side view of one embodiment of a data center.

One embodiment of a cooling system with mixing of return air and outside air is illustrated in FIG. 10. Facility 800 includes cooling system 802 and data center 804. Cooling system 802 includes enclosure 806 and fan 807. Cooling coil bank 822 may reside in enclosure 806. Fan 807 may force air across cooling coil bank 822, through duct 809, and into plenum 808. Air may flow from plenum 808 into room 812 and cool racks 810. Air may flow from room 812 into return duct 818. Return duct 818 may carry return air back to return air intake 816. Outside air may be received into intake 824. In certain embodiments, intake 824 for an outside air may include textured surfaces, narrowed passages, or sloping surfaces to increase resistance to flow through the intake.

In one embodiment, large scale (250 to 300 ton) units may be divided into two flow vanes, connected at the intake and the exhaust manifolds. Each vane may be separated by a firewall. Fan drivers (VFDs) may be recessed back and behind a second firewall. Segregated air streams may be kept on each fan (air pump). Additionally, by placing the fan behind the cool air stream, the heat input from the driver (fan motor) may be minimized.

As used herein, a "damper" includes any device or component that can be moved to control (e.g., increase or decrease) the flow of fluid through a duct or other passageway. Examples of dampers include plates, blades, panels, or discs, or any combination thereof. A damper may include multiple elements. For example, a damper may include a series of plates in parallel relation to one another that can be simultaneously rotated to close a duct. As used herein, to "position" a damper means to place or leave one or more elements of the damper to achieve desired flow characteristics through the damper, such as open, closed, or partially open. In a system with 18 air handling sub-systems, positioning the outside air dampers may include opening outside air dampers in 8 of the sub-systems and keeping outside air dampers closed in the other 10 sub-systems.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A system, comprising:
   one or more air handling sub-systems configured to provide cooling air to electronic equipment, wherein the air handling sub-systems comprises:
      two or more return dampers that control flow of return air,
      two or more return air flow chambers downstream from the two or more return dampers and that individually comprise volumetric space for respective portions of return air flow received from respective return air vents,
      one or more outside air flow chambers that individually comprise volumetric space for respective portions of outside air flow received via respective outside air vents,
      one or more outside dampers located between the respective outside air vents and the one or more outside air flow chambers and that individually control flow of outside air flow to respective ones of the one or more outside air flow chambers,
      a mixing chamber for mixing air from the two or more return air flow chambers and the one or more outside air flow chambers, and
      a common exit for air flow exiting from the mixing chamber upstream of the electronic equipment,
      an interior wall extending at least partially between at least two of the air flow chambers; and
   at least one heat removal sub-system, downstream from the common exit, and comprising conduit configured to remove heat from cooling air in the one or more air handling sub-systems.

2. The system of claim 1, further comprising a firewall between at least two of the flow chambers.

3. The system of claim 1, further comprising a variable frequency drive (VFD) configured to drive at least one fan in individual ones of the two or more return air flow chambers.

4. The system of claim 3, wherein the variable frequency drive is recessed with respect to air flow in the two or more return air flow chambers behind one or more additional firewalls, the one or more additional firewalls configured to minimize heat input from the variable frequency drive into the air flow through the two or more return air flow chambers.

5. The system of claim 1, wherein the at least one heat removal sub-system comprises:
   the conduit, comprising at least one cooling coil bank configured to remove heat from a flow of the cooling air through the at least one heat removal sub-system; and
   at least one filter installed upstream of the at least one cooling coil bank in the flow of the cooling air;
   wherein each of the cooling coil bank and filter are installed at an angle relative to the flow of the cooling air.

6. The system of claim 1, wherein:
   the system comprises at least one temperature sensor configured to measure a wet bulb temperature of outside air; and
   the system further comprises at least one controller coupled in electronic data communication with the at least one temperature sensor and at least one of the one or more outside air dampers, the at least one controller being configured to at least partially open at least one of the one or more outside air dampers if a wet bulb temperature measured at the at least one temperature sensor drops to or below a predetermined temperature.

7. A method of cooling electronic components in a room, comprising:
   providing an air handling system comprising:
      two or more return air flow chambers that individually comprise volumetric space for respective portions of the air flow,
      two or more return dampers located upstream of respective ones of the two or more return air flow chambers and that individually control flow of return air to respective ones of the two or more return air flow chambers,
      one or more outside air flow chambers that individually comprise volumetric space for respective portions of outside air flow received via respective outside air vents,
      an interior wall that extends at least partially between at least two of the air flow chambers,
      one or more outside dampers located between the respective outside air vents and the one or more outside air flow chambers and that individually control flow of outside air flow to respective ones of the one or more outside air flow chambers, and
      a mixing chamber for mixing air from the two or more return air flow chambers and the one or more outside air flow chambers, the mixing chamber having a common exit for air flow exiting from the mixing chamber;
   providing a heat removal sub-system comprising conduit that removes heat from cooling air that exits the common exit of the mixing chamber of the air handling system; and
   receiving return air flow from the room into one or more of the return air flow chambers of the air handling system and channeling at least a portion of the return air flow from the room through the heat removal sub-system prior to returning the air from the room back to the room.

8. The method of claim 7, further comprising providing a firewall between two of the flow chambers.

9. The method of claim 7, further comprising:
   mixing airflows via the mixing chamber; and
   channeling return airflow from the room via at least two of the return air flow chambers.

10. The method of claim 7, further comprising driving at least one fan in individual ones of the two or more return air flow chambers by a variable frequency drive (VFD) of the portion of the air handling system.

11. The method of claim 10, wherein the variable frequency drive is recessed with respect to air flow in the two or more return air flow chambers behind one or more additional firewalls.

12. The method of claim 7, wherein:
   providing the heat removal sub-system comprises:
   providing the conduit comprising at least one cooling coil bank configured to remove heat from a flow of the cooling air through the heat removal sub-system; and
   installing at least one filter upstream of the at least one cooling coil bank in the flow of the cooling air;

wherein each of the cooling coil bank and filter are installed at an angle relative to the flow of the cooling air.

13. The method of claim 7, comprising:

measuring, via at least one temperature sensor, a wet bulb temperature of outside air; and determining, by at least one controller coupled in electronic data communication with the at least one temperature sensor and at least one of the one or more outside air dampers, that the wet bulb temperature of the outside air has dropped to or below a predetermined temperature, and in response:

at least partially opening the at least one outside air damper to allow outside air into the air handling system; and channeling at least a portion of the outside air through the air handling system and into the room.

14. An apparatus, comprising:

an air handling system configured to provide cooling air to electronic equipment, the air handling system comprising:

two or more return air flow chambers that individually comprise volumetric space for respective portions of the cooling air, two or more return dampers located upstream of respective ones of the two or more return air flow chambers and that individually control flow of return air for respective ones of the two or more return air flow chambers, one or more outside air flow chambers that individually comprise volumetric space for respective portions of outside air flow received via respective outside air vents, an exterior wall the extends at least partially between at least two of the air flow chambers, one or more outside dampers located between the respective outside air vents and the one or more outside air flow chambers and that individually control flow of outside air flow to respective ones of the one or more outside air flow chambers, and a mixing chamber for mixing air from the two or more return air flow chambers and the one or more outside air flow chambers, the mixing chamber having a common exit for air flow exiting from the mixing chamber.

15. The apparatus of claim 14, the air handling system further comprising at least one firewall between at least two of the two or more return air flow chambers.

16. The apparatus of claim 14, the air handling system further comprising a variable frequency drive (VFD) configured to drive at least one fan in each of the two or more return air flow chambers.

17. The apparatus of claim 16, wherein the variable frequency drive is recessed with respect to air flow in the two or more return air flow chambers behind one or more additional firewalls.

18. The apparatus of claim 14, comprising:

at least one heat removal system configured to remove heat from the cooling air upstream of the electronic equipment, the at least one heat removal system comprising:

at least one cooling coil bank configured to remove heat from a flow of the cooling air; and at least one filter, installed upstream of the at least one cooling coil bank, in the flow of the cooling air;

wherein each of the cooling coil bank and filter are installed at an angle relative to the flow of the cooling air.

* * * * *